US010712376B2

(12) United States Patent
Knierim

(10) Patent No.: US 10,712,376 B2
(45) Date of Patent: Jul. 14, 2020

(54) IMPEDANCE MEASUREMENT OF INDIVIDUAL ACTUATORS OF A PIEZOELECTRIC PRINT HEAD

(71) Applicant: XEROX CORPORATION, Norwalk, CT (US)

(72) Inventor: David L. Knierim, Wilsonville, OR (US)

(73) Assignee: XEROX CORPORATION, Norwalk, CT (US)

( * ) Notice: Subject to any disclaimer, the term of this patent is extended or adjusted under 35 U.S.C. 154(b) by 224 days.

(21) Appl. No.: 15/940,556

(22) Filed: Mar. 29, 2018

(65) Prior Publication Data

US 2019/0302160 A1   Oct. 3, 2019

(51) Int. Cl.
*G01R 27/28* (2006.01)
*G01R 27/26* (2006.01)
*B41J 2/045* (2006.01)

(52) U.S. Cl.
CPC ...... *G01R 27/2605* (2013.01); *B41J 2/04541* (2013.01); *B41J 2/04581* (2013.01)

(58) Field of Classification Search
CPC ........ G01R 27/08; G01R 27/10; G01R 27/14; G01R 27/16; G01R 27/2605; G01R 27/2623; B41J 2/04525; B41J 2/04581; B41J 2/0451; B41J 2/04541; B41J 2/04555
See application file for complete search history.

(56) References Cited

U.S. PATENT DOCUMENTS

| | | | |
|---|---|---|---|
| 6,812,621 B2 | 11/2004 | Scott | |
| 7,029,082 B2* | 4/2006 | Farr | B41J 2/17566 347/7 |
| 9,022,515 B2 | 5/2015 | Ready et al. | |
| 9,457,560 B2 | 10/2016 | Ready et al. | |
| 2004/0051750 A1* | 3/2004 | Groninger | B41J 2/04525 347/19 |
| 2006/0061615 A1* | 3/2006 | Yagi | B41J 2/0451 347/19 |
| 2006/0066683 A1* | 3/2006 | Hara | B41J 2/0451 347/68 |
| 2006/0082617 A1* | 4/2006 | Nagashima | B41J 2/0451 347/68 |
| 2010/0238212 A1* | 9/2010 | Lecheheb | B41J 2/12 347/9 |
| 2016/0121611 A1* | 5/2016 | Reinten | B41J 2/14233 347/71 |
| 2018/0170034 A1* | 6/2018 | Anderson | B41J 2/16579 |

* cited by examiner

*Primary Examiner* — Thang X Le
(74) *Attorney, Agent, or Firm* — Miller Nash Graham & Dunn LLP

(57) ABSTRACT

A method for measuring an impedance of each of a plurality of piezoelectric actuators of a print head, each piezoelectric actuator connected to electronic selection circuitry of the print head that drives the piezoelectric actuators during a print operation. The method includes generating a waveform to drive a drive rail of the print head, the drive rail connected to the electronic selection circuitry of the print head and measuring an impedance of each of the plurality of piezoelectrical actuators of the print head through the electronic selection circuitry.

18 Claims, 4 Drawing Sheets

IMPEDANCE MEASUREMENT OF INDIVIDUAL ACTUATORS OF A PIEZOELECTRIC PRINT HEAD

TECHNICAL FIELD

This disclosure relates to testing print heads, and in particular, to measuring an impedance of piezoelectric actuators of a print head using an impedance meter.

BACKGROUND

Piezoelectric ink jet print heads have many features and failure mechanisms that may be characterized or diagnosed by measuring an impedance of a piezoelectric actuator of the print head over a sweep of frequencies. For example, an impedance measurement of a piezoelectric actuator of the print head may show issues with electrical connectivity, mechanical and fluidic resonances of individual ink jets, and crosstalk between neighboring ink jets of the print head.

Conventionally, ink jet impedance sweep measurements are taken with a commercial impedance meter wired to one jet at time, making it impractical to run an impedance sweep measurement on all the ink jets of a print head, due to the time constraints of constantly rewiring the impedance meter to each jet.

Embodiments of the disclosure address these and other deficiencies in the prior art.

SUMMARY

One embodiment of the disclosure herein includes a method for measuring an impedance of each of a plurality of piezoelectric actuators of a print head, each piezoelectric actuator connected to electronic selection circuitry of the print head that drives the piezoelectric actuators during a print operation. The method includes generating a waveform to drive an impedance bridge and/or a drive rail of the print head, one element of the impedance bridge consisting of the electronic selection circuitry of the print head, measuring an impedance of the plurality of piezoelectrical actuators of the print head through the electronic selection circuitry.

Another embodiment includes an impedance meter for measuring an impedance of each of a plurality of piezoelectric actuators of a print head, each piezoelectric actuator connected to electronic selection circuitry of the print head. The impedance meter may include an impedance bridge electrically connected to the electronic selection circuitry of the print head through a drive power rail, a waveform generator configured to generate a plurality of waveforms at a plurality of frequencies to drive the impedance bridge and/or a drive rail of the print head, and an analog-to-digital converter electrically connected to the drive rail and configured to output a measured impedance of each of the plurality of piezoelectrical actuators of the print head.

DETAILED DESCRIPTION OF THE EMBODIMENTS

Piezoelectric ink jet print heads generally use one or two waveform drive rails to which individual ink jets are connected, generally through electronic selection circuity, such as an application specific integrated circuit (ASIC), to fire ink drops towards a print medium. For the two-rail case, positive portions of waveforms are on a VPP drive rail while negative portions of the waveforms are on a VSS drive rail. A base capacitance on each of the drive rails, with no ink jets connected, is approximately 50 nF to 70 nF. Connecting one ink jet to a drive rail may add, for example, 55 pF additional capacitance, or a roughly 0.1% increase in capacitance. An impedance meter of embodiments herein measures the piezoelectric actuators for each jet by measuring this additional capacitance and comparing it to a reference capacitance to determine the impedance and/or capacitance of each individual ink jet. The additional capacitance may be measured on either the VSS drive rail or the VPP drive rail. In embodiments discussed below, the VSS drive rail is used for the measurements, but one of ordinary skill in the art would recognize the ability to do such measurements on the VPP drive rail as well, or on a single drive rail for print heads implementing only one waveform rail.

Figure 1:
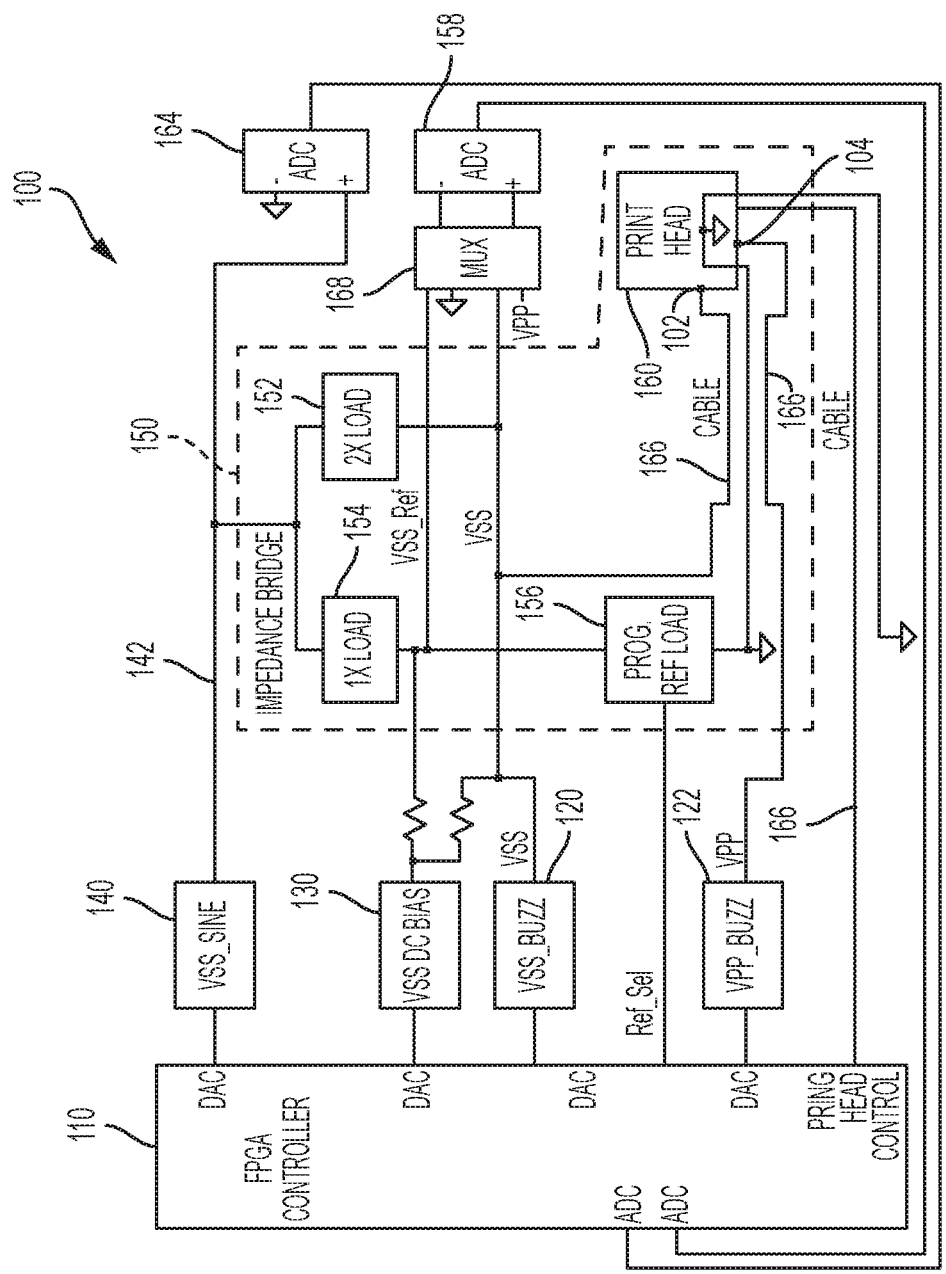
FIG. 1 shows an example block diagram of an impedance meter according to embodiments disclosed herein.

FIG. 1 illustrates an example circuitry block diagram of an impedance meter, according to some embodiments of the disclosure. As will be understood by one skilled in the art, both the impedance meter and the print head may include additional components not discussed in detail herein.

The impedance meter 100 includes a controller 110, a VSS buzz block 120, a VPP buzz block 122, a bias block 130, and a sine block 140. Although two buzz blocks 120 and 122 are shown, each connected to a drive rail 102 and 104 of the print head 160, a single buzz block may also be used, as would be understood by one skilled in the art. VSS buzz block 120, the bias block 130, and the sine block 140 are electrically connected to an impedance bridge 150, which is completed when connected to the print head 160.

Although FIG. 1 shows the print head 160 as part of the impedance meter 100, as will be understood by one skilled in the art, the print head 160 connects to the impedance meter 100 to complete the impedance bridge 150. The print head 160 may connect to the impedance bridge 150 through one or more cables 166, which connects the drive rails 102 and 104 of the print head 150 to the impedance meter 100, as discussed below in more detail in FIG. 3. The one or more cables 166 may also connect the print head 160 controls to the controller 110 so that the controller 110 may send control signals to the print head 160.

The cables 166 may be, for example, shielded cables, such as a one-sided shielded cable, and may also include one or more connections to the VSS drive rail 102, the VPP drive rail 104 and/or the print head control. As will be understood by one of ordinary skill in the art, the impedance meter 100 may connect to the VSS drive rail 102, VPP drive rail 104 and the print head control (not shown) through any type of suitable cable.

The impedance bridge 150 may also include three loads 152, 154, and 156, as discussed in further detail below with respect to FIG. 2. The impedance bridge 150 is connected to an analog-to-digital converter (ADC) 158 to take impedance readings through a multiplexor 168. The multiplexor 168 may also receive a signal on the VPP drive rail 104.

Controller 110 determines the impedance and/or the capacitance of each of the piezoelectric actuators of the print head based on these readings. The impedance meter 100 may also include a reference ADC 164 that receives the waveform 142 from the sine block 140, as well as connected to ground. VPPVSSVSS FIG. 2 illustrates another block diagram showing additional components that may be included in the various features discussed above with respect to FIG. 1. The process of measuring impedance of each of the piezoelectric actuators will be discussed below with respect to FIGS. 1 and 2. For simplicity, some components have been excluded from FIG. 2 to ease the discussion of the impedance measurement. For example, the cable 166 is not shown in FIG. 2, but would be used to connect the drive rail 102 of the print head to the impedance meter 100.

Initially, the VSS buzz block 120 drives the VSS drive rail 102 from its quiescent level of 0V down to a bias level of typically −15V, for example. The VSS buzz block 120 receives a signal from the controller 110 and generates a direct current (DC) voltage signal in response to the signal from the controller 110. The buzz block 110 is then set to high impedance by setting the VSS buzz DAC 126 to 0V and leaving current source 124 disabled (set to zero current). The bias block 130 may then be enabled to keep the VSS drive rail 102 at the bias level, −15V in this example, during an impedance measurement.

Next, a sine drive line 142 is enabled to drive the impedance bridge 150 at a particular frequency required for the impedance measurement. The sine block 140 receives a signal from the controller 110 through its digital-to-analog converter (DAC). The sine block 140 then outputs the required periodic signal, which may be, for example, a sine waveform. After a short settling time, readings from ADC 158 are collected for a predetermined measurement integration interval, such as 250 μs, for example, through a transformer 162. That is, a signal from both sides of the impedance bridge 150 are sent through transformer 162 to determine the impedance measurement. The impedance bridge 150 may include an electronically adjustable load 156 that can be adjusted so that there is virtually no voltage difference between the two sides of the impedance bridge 150 when none of the piezoelectric actuators are connected to the VSS drive rail 102.

Each ADC 158 reading of the predetermined measurement integration interval is multiplied by sine and cosine at the frequency of the sine drive signal on the sine drive line 142 to determine a number of product values. The product values for sine are summed together and the products for cosine are summed together across the predetermined integration interval to determine two sum-of-products values. The two sum-of-products values, one for sine and one for cosine, are each sent to another controller or processor, such as a personal computer (PC), for further processing. After the predetermined integration interval, the current source 124 is switched on to drive the VSS drive rail 102 to its quiescent level of 0V.

Figure 3:
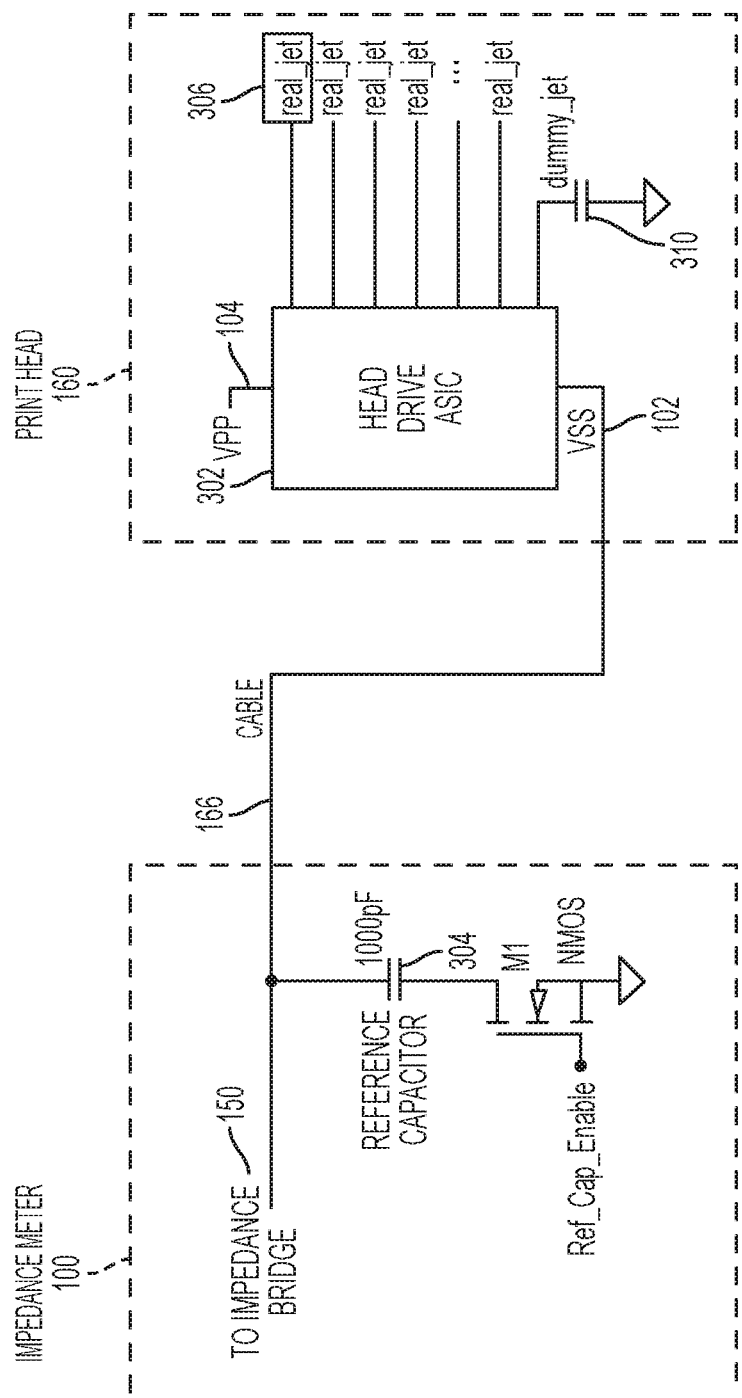
FIG. 3 illustrates the connection between the impedance meter of FIG. 1 and the print head and specific components within each.

FIG. 3 illustrates a more detailed view of portions of the impedance meter 100 connected to drive rail 102 of the print head 160 through a cable 166. The left portion of FIG. 3 illustrates the reference capacitor of impedance meter 100, while the right portion of FIG. 3 illustrates the print head 160 connected to the impedance meter through cable 166.

The print head 160 includes one or more controllers, such as an application-specific integrated circuits (ASICs) 302, which drives the various piezoelectric actuators of the various ink jets to eject ink through an aperture of each of the ink jets. While only a single ASIC 202 is shown in FIG. 3, one of ordinary skill in the art will understand that the print head 160 may have a plurality of ASICs 302 that share the common VSS drive rail 102 and VPP drive rail 104. VPPVSS. That is, the ASIC 302 is electronic selection circuitry that is capable of selecting between one or more of the various piezoelectric actuators connected to the ASIC 302.

Each ASIC 302 is connected to a number of piezoelectric actuators of real ink jets, referred to herein as a real jet 306. The ASIC 302 is also connected to one or more dummy jets, which are outputs of the ASIC 302 that are connected to capacitors 310 on a head drivers electrical circuit board, rather than to a real jet piezoelectric actuator. For ease of discussion, capacitors 310 are also referred to as the dummy jets 310 or pseudo-actuators. One or more dummy jets 310 may be selected during an impedance measurement instead of a real jet 306, as will be discussed in more detail below.

The impedance meter 100 includes a reference capacitor 304 that connects to the VSS waveform rail 102 through cable 166. As will be discussed in more detail below, the reference capacitor 304 is used by the impedance meter 100 to accurately measure dummy jet 310 capacitances at low frequencies, such as below 300 KHz, where the impedance of cable 166 from the impedance meter 100 to the print head 160 is not significant. The capacitors 310 of the dummy jets are then used as a reference capacitance for measuring real jets 306 because the dummy jets are local to the print head 160 and therefore more accurate at high frequencies than the reference capacitor 304. That is, once a capacitance and impedance is known for the dummy jets 310, the impedance measurement of a real jet 306 may be compared to the impedance reading on the dummy jets 310 to determine the actual impedance at the real jet 306.

Figure 2:
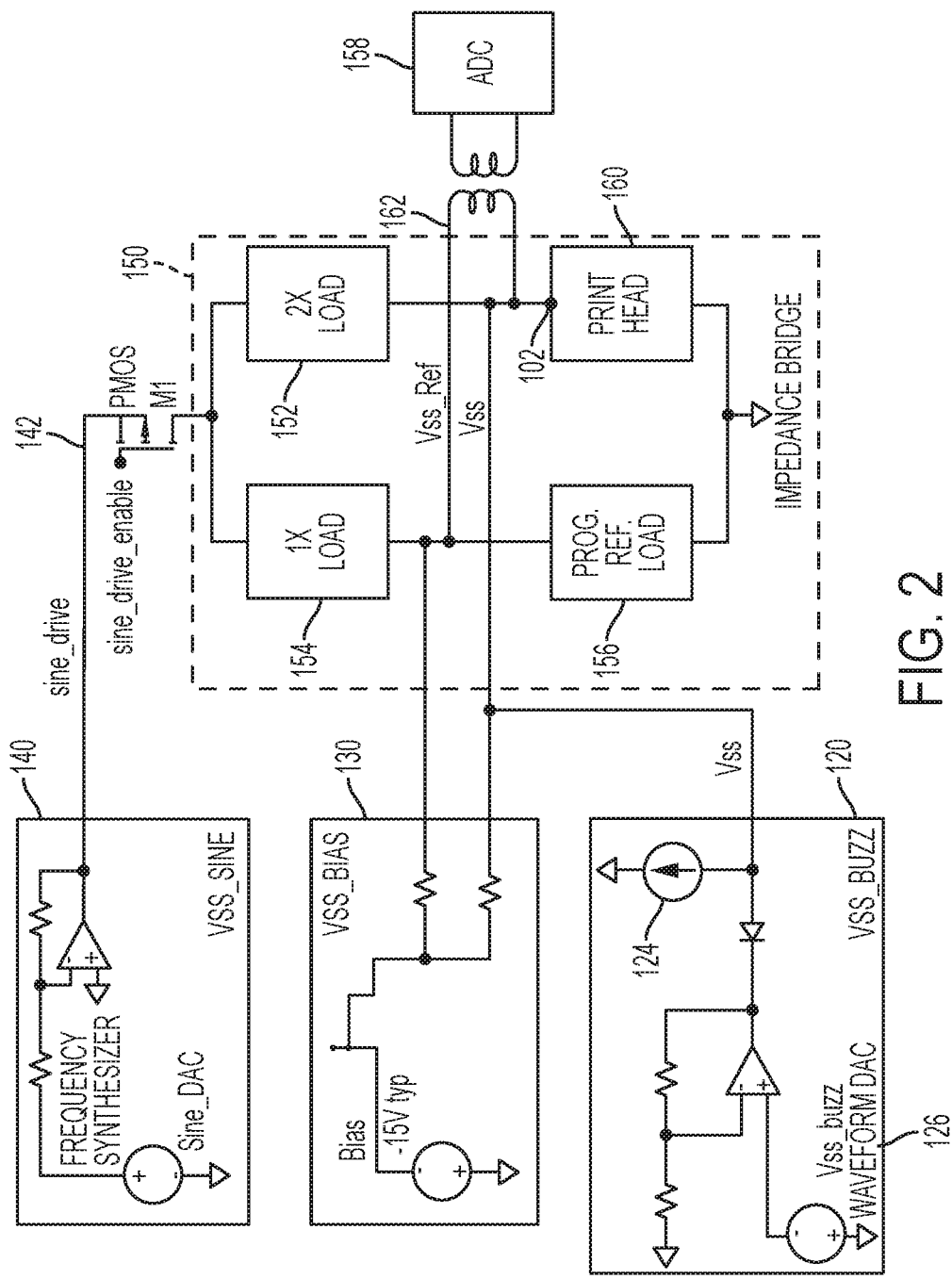
FIG. 2 illustrates a more detailed view of some of the components of the impedance meter shown in FIG. 1.
Figure 4:
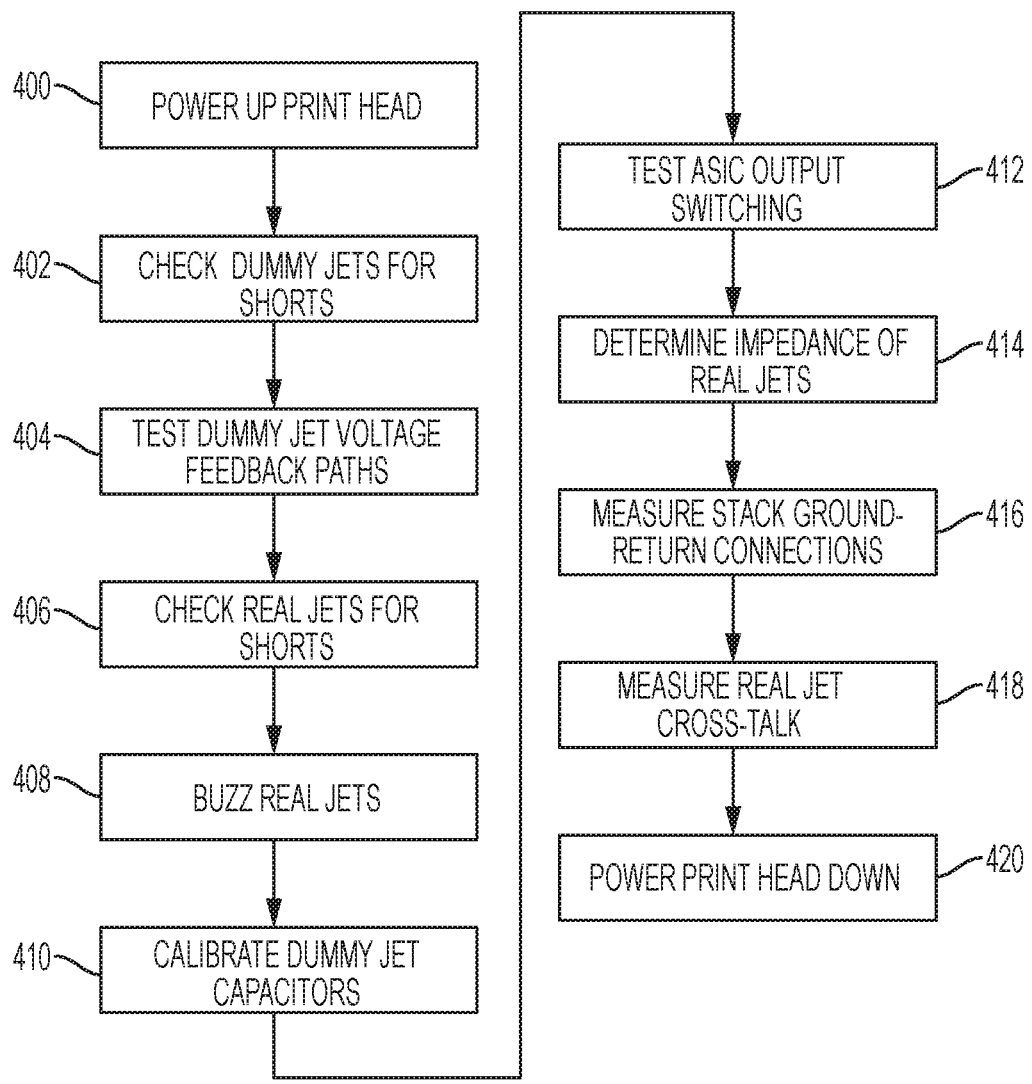
FIG. 4 is a flow chart illustrating various operations of the impedance meter of FIG. 1.

FIG. 4 illustrates a flow chart for a typical impedance measurement test of the print head 150 using the impedance meter 100 of FIGS. 1-3, for example. The impedance measurement test includes multiple other types of readings, such as current, etc. to determine whether any issues are present in the print head 160. While the following is referred to as an impedance test, one of ordinary skill in the art will recognize that the individual measurements may be performed without performing the rest of the measurements if one particular issue is being tested.

Initially, in operation 400, the print head is powered up and the head power-supply currents are measured. The print head 160 is warmed up if the measurement is at an elevated temperature, and an initial print head temperature is recorded.

In operation 402, dummy jets 310 are checked for shorts in the same manner as the real jets 306. Any shorted dummy jets 310 are masked in all further operations.

In operation 404, the dummy jet 310 voltage feedback paths are tested by applying a known voltage, such as +/−45V through the VSS drive rail 102 and the VPP drive rail 104 with all dummy jets 310 enabled. The print head's 160 dummy jet 310 ADC channel (not shown) is read and compared to a measurement taken by an ADC within the impedance meter (not shown) of average VSS drive rail 102 and VPP drive rail 104 voltages.

In operation 406, real jets 306 are checked for shorts by applying voltage pulses to both the VSS drive rail 102 and the VPP drive rail 104 and measuring the currents of the drive rails before and after jets are connected. Any shorted real jet 306 is masked in all subsequent operations.

In operation 408, the real jets 306 are "buzzed" using pulses, such as −40V and +20 on the VSS drive rail 102 and VPP drive rail 104 using pulses from the VSS buzz block 120 and the VPP buzz block 122, respectively, for a predetermined amount of time, such as 5 seconds, if a buzzing command is specified. Buzzing helps heal nanometer-gap cap opens in the print head 160.

In operation 410, the dummy jet capacitors 310 are measured using the reference capacitor 304 of the impedance meter 100 to determine the capacitance. That is, the impedance meter 100 may calibrate the dummy jets 310 to use as a reference during an impedance measurement, discussed below. The dummy jet capacitors 310 are measured at two frequencies, such as 128 KHz and 256 KHz, and extrapolated to 0 Hz.

In operation 412, the ASIC 302 output switching is tested. Outputs of the ASICs 302 are toggled between VPP and VSS at a predetermined frequency, such as 2.078 MHz, one at a time, with −10V on VSS drive rail 102 and 0V on VPP drive rail 104. The amplitude of a waveform on the sine drive rail 142 is set to zero. The measured signal comes from the ASIC 302 output switching current. This is less accurate than a normal impedance measurement, so it is used primarily for ASIC 302 operational verification. Operation 412 may also help heal nanometer-gap can opens in the print head 160.

In operation 414, the real jet 306 impedance at each frequency of a specified frequency sweep is measured for each real jet 306. As mentioned above, the capacitors 310 on the print head 160 are used as the reference capacitors for this measurement to determine the impedance of each jet for each frequency over the specified frequency sweep. This measurement may take, for example, 2.8 seconds to measure all real jets 306 of a typical print head containing 5500 real jets 306 for each frequency point in the frequency sweep. That is, a first waveform is generated at a first frequency and the electronic selection circuitry, or ASICs 302, switches to one of the various real jets 306, or connected piezoelectric actuators, to gather a reading for that real jet 306 at that frequency. This is repeated for each real jet 306, each dummy jet 310, and interspersed with readings with no jets connected (baseline). Then a second waveform is generated at a second frequency and the process repeats. This performed until the entire frequency sweep range has been measured.

Impedance may also be measured by toggling a piezoelectric actuator through the ASIC 302 to the VSS drive rail 102 and the VPP drive rail 104 and measuring an amplitude and phase of the signal on one or both of the VSS drive rail 102 and the VPP drive rail 104. The impedance magnitude may be measured by toggling a piezoelectric actuator through the ASIC 302 to the VSS drive rail 102 and the VPP drive rail 104 and measuring a DC current on or both of the VSS drive rail 102 and the VPP drive rail 104 caused by the toggling. In some embodiments, the local switching-regulator frequency or duty cycle of the print head 160 may be locked.

Plots of capacitance versus frequency are often easier to view and quicker to glean information from since real jet 306 capacitance usually does not change by orders-of-magnitude across a plot. As such, while the measurement taken is an impedance measurement, since the impedance of a capacitor scales as one over frequency, the impedance meter 100 may report the capacitance that would be required to generate the measured impedance instead of, or in addition to, the impedance measurement itself for each real jet 306.

In operation 416, stack, also referred to as diaphragm layer, ground-return connections are measured. To do such, approximately one seventh of the real jets 306 connected to a single ASIC 302 are driven at a time at a specified frequency, such as 9 MHz or 15 MHz, through the VSS drive rail 102. The remaining real jets 306 are connected to VPP drive rail 104 and the amplitude and phase of the VPP drive rail 104 current is measured through ADC 158. This current is scaled as a fraction of the expected current through the driven real jets 306. That is, the measured current is scaled by the reciprocal of the total capacitance of the driven real jets 306, skipping any masked real jets, as discussed above in operation 404. A high current reading indicates bad ground connections since current is returning through other jets rather than the intended ground path.

In operation 418, jet cross talk between the real jets 306 is measured. Individual real jet 306 capacitances are measured at a specific frequency, such as 256 KHz, and then the capacitances are again re-measured in pairs—that is, when two physically-adjacent real jets 306 are connected. Crosstalk is the difference between the sum of two individual readings and a reading of the pair of real jets 306 together. The base electrical coupling between real jets 306, that is the capacitance between traces, must be subtracted from these readings to provide meaningful mechanical or fluidic cross talk measurements.

In operation 420, an ending head temperature and power supply current are recorded and the print head 160 is powered down. As will be understood by one skilled in the art, although the features discussed above are shown in a particular order and flow, measurements may be taken in different orders from what is shown in FIG. 4 and discussed above. That is, the operations above are not limited to the particular order shown in FIG. 4.

Throughout any of these measurements, the impedance meter 100 may perform periodic measurements without any real jets 306 or dummy jets 310 connected to the impedance bridge 150. This allows the impedance meter 100 to compensate for zero-drift.

Although FIGS. 1-4 discuss measuring the impedance of the real jets 306 and the dummy jets 310 through an impedance bridge 150, embodiments disclosed herein are not limited to such a configuration. The impedance bridge 150 reduces an amplitude of the input signal to ADC 158, making a change due to jet impedance on the drive rail being measured relatively large. However, periodic waveform 142 from sine block 140 may be sent to drive rail 102 and/or drive rail 104 directly, and the ADC 158 may measure the impedance of the respective drive rail when various real jets 306 and dummy jets 310 are connected to the drive rail 102 or 104 through the electronic switching circuitry, or ASIC 302. That is, although the impedance bridge 150 may be beneficial to increasing any change due to jet impedance, such is not required for all embodiments of the disclosure.

Returning to operation 412, the impedance sweeps can confirm both electrical and mechanical operations of ink jets. For example, turning to electrical operations, a very low capacitance for a real jet 306 that is flat with frequency may indicate that there are open connections in the print head 160. Excess VPP current not returning to the VSS drive rail 102 and vice-versa may indicate that there is a short-to-ground issue. A jet-to-jet short may be determined when there is excess VPP-to-VSS current.

Further, a poor connection, typically between the piezoelectric element and either the diaphragm layer below or a chip-on-flex (COF) contact above may also be identified using the impedance sweep. Such a poor connection would result in real capacitance starting low at a low frequency and dropping to almost zero at approximately 9 MHz. Loss, or an imaginary capacitance, starts high, peaks, and then drops along with the real capacitance at high frequencies. Parallel conductivity may be identified when capacitance starts on the higher side at low frequency, dropping to normal at higher frequencies, while the loss starts high and drops toward zero at higher frequencies. Parallel conductivity is typically caused by ink leaking into the piezoelectric area.

Turning to mechanical connections, a normal shaped capacitance sweep, but scaled down, may indicate that there is a cracked piezoelectric element not connected. Further, an impedance sweep having high capacitance across the frequency range may indicate a cracked or delaminated piezoelectric element. For a cracked or delaminated piezoelectric element, the mechanical resonances are of lower amplitude due to the inefficient electrical-to-mechanical coupling. Subtler piezoelectric cracks that do not show up as high capacitance may still be detected by changes in diaphragm resonances and piezoelectric element's radial resonance.

Mechanical and fluidic resonances show up as peaks in the loss (imaginary) capacitance vs. frequency plots. Dry, pre-ink-filled, impedance sweeps show two primary resonances. The first primary resonance is the diaphragm drumhead resonance, which may be around 900 KHz, for example. The drum-head motion of the diaphragm approximates the motion used in jetting ink, that is, bending the diaphragm out of and into the body chamber of the print head. Changes in the frequency, width, and/or amplitude of the diaphragm resonance often correlate with changes in jetting performance, that is, the drive voltage requires to eject drops.

The second primary resonance is controlled by the piezoelectric element itself, rather than by the diaphragm. The resonance amplitude is generally higher if the piezoelectric element is delaminated from the diaphragm since it is less constrained. Cracks may show up best on this resonance, especially combinations of vertical and horizontal cracks where no remaining piezoelectrical pieces have dimensions large enough to resonate at this second primary resonance. The secondary primary resonance remains largely unaffected by ink-fill, unlike the first primary resonance.

Fluidic resonances are present on filled print heads 150. With ink, the diaphragm resonance is gone. There is a low-amplitude, but important, low-frequency resonance call a Helmholtz resonance. It is sensitive to the entire single-jet fluid path from the orifice back. There is another resonance, around 550 KHz, for example, where gas bubbles within single-jet features generally shift this resonance higher or lower in frequency depending on the size and location of the bubble. Detecting bubbles by this frequency shift is perhaps the dominant use the impedance meter 100.

Impedance meter measurement noise is typically under 0.1 pF for frequencies between 60 KHz and 1.3 MHz, rising to about 0.3 pF by 9 MHz. This noise is a couple parts per million of the total VSS drive rail capacitance. The single biggest challenging in the impedance meter 100 design is reducing noise sources to achieve the needed sensitivity. Noise can be an ongoing problem in impedance meter 100 operation as well. Even slight changes in cable connection impedance can cause large noise spikes. For example, bumping a waveamp cable during a scan, or having a waveamp cable wiggle in a breeze of a fan can cause measurement noise issues. However, such noise issues are easily detected by the measurement readings and can be accounted for in the set up.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method for measuring an impedance of each of a plurality of piezoelectric actuators of a print head, each piezoelectric actuator connected to electronic selection circuitry of the print head that drives the piezoelectric actuators during a print operation, comprising:
    generating a waveform to drive a drive rail of the print head, the drive rail connected to the electronic selection circuitry of the print head;
    measuring an impedance of each of the plurality of piezoelectrical actuators of the print head through the electronic selection circuitry while the drive rail of the print head is driven by the waveform by comparing the measured impedance of each of the piezoelectric actuators to a reference impedance from a pseudo-actuator connected to the electronic selection circuitry.

2. The method of claim 1, further comprising calibrating the pseudo-actuators using a reference capacitor in the impedance meter connected to the impedance bridge to determine a reference impedance of the pseudo-actuators.

3. The method of claim 2, wherein the pseudo-actuators are calibrated at frequencies less than 300 KHz, the method further comprising determining the impedance of each of the plurality of piezoelectric actuators using the reference impedance of the pseudo-actuators at frequencies greater than 300 KHz.

4. The method of claim 1, further comprising measuring an impedance of the drive rail when disconnected from all actuators and pseudo-actuators connected to the electronic selection circuitry.

5. The method of claim 1, further comprising applying a direct current bias signal to the drive rail.

6. The method of claim 5, further comprising measuring a current of the direct current bias signal to detect shorted piezoelectric actuators.

7. The method of claim 6, further comprising removing detected shorted piezoelectric actuators from subsequent impedance measurements.

8. The method of claim 1, further comprising measuring an impedance of pairs of physically adjacent piezoelectric actuators simultaneously and separately.

9. The method of claim 1, further comprising applying a voltage greater than or equal to 20V to the electronic switching circuitry prior to measuring an impedance.

10. The method of claim 1, wherein the generated waveform is a periodic waveform and a drive power rail of the electronic selection circuitry is measured while a piezoelectric actuator is connected and when a piezoelectric actuator is not connected.

11. The method of claim 1, further comprising measuring an impedance magnitude of the plurality of piezoelectrical actuators by toggling a piezoelectric actuator between connections to two drive power rails and measuring current on at least one of the two drive power rails.

12. The method of claim 1, further comprising measuring a piezoelectric actuator ground-return impedance by generating a periodic waveform signal to a drive power rail and measuring a resulting signal on another drive power rail while a first set of the piezoelectric actuators are connected to the drive power rail and a second set of the piezoelectric actuators are connected to the other drive power rail.

13. The method of claim 1, further comprising locking a switching regulator frequency or duty cycle of the print head during an impedance measurement.

14. A method for measuring an impedance of each of a plurality of piezoelectric actuators of a print head, each piezoelectric actuator connected to electronic selection circuitry of the print head that drives the piezoelectric actuators during a print operation, comprising:
    generating a waveform to drive a drive rail of the print head, the drive rail connected to the electronic selection circuitry of the print head;
    measuring an impedance of each of the plurality of piezoelectrical actuators of the print head through the electronic selection circuitry while the drive rail of the print head is driven by the waveform by toggling a piezoelectric actuator between connections to two drive power rails and measuring an amplitude and phase of the signal on at least one of the two drive power rails.

15. An impedance meter for measuring an impedance of each of a plurality of piezoelectric actuators of a print head, each piezoelectric actuator connected to electronic selection circuitry of the print head, comprising:
    a waveform generator configured to generate a plurality of waveforms at a plurality of frequencies to drive a drive rail of the print head connected to the electronic selection circuitry;
    an analog-to-digital converter electrically connected to the drive rail and configured to output a measured impedance of each of the plurality of piezoelectrical actuators connected to the electronic selection circuitry of the print head while the drive rail of the print head is driven by at least one of the plurality of waveforms; and
    a controller configured to determine an impedance of each of the plurality of piezoelectric actuators of the print head by comparing the measured impedance of each of the piezoelectric actuators to a reference impedance from a pseudo-actuator connected to the electronic selection circuitry.

16. The impedance meter of claim 15, further comprising:
    a reference capacitor connected to the impedance bridge, wherein the controller calibrates the pseudo-actuators based on the reference capacitor.

17. The impedance meter of claim 15, wherein the generated waveform is a periodic waveform and the analog-to-digital converter is configured to output a measured impedance when a piezoelectric actuator is connected and when a piezoelectric actuator is not connected.

18. The impedance meter of claim 15, wherein measuring an impedance of the plurality of piezoelectrical actuators includes measuring the impedance by toggling a piezoelectric actuator between connections to two drive rails and measuring an amplitude and phase of the signal on at least one of the two drive rails.

* * * * *